United States Patent

Strite

[19]

[11] Patent Number: 6,023,073
[45] Date of Patent: Feb. 8, 2000

[54] ORGANIC/INORGANIC ALLOYS USED TO IMPROVE ORGANIC ELECTROLUMINESCENT DEVICES

[75] Inventor: Samuel Clagett Strite, Kilchberg, Switzerland

[73] Assignee: International Business Machines Corp., Armonk, N.Y.

[21] Appl. No.: 08/711,625

[22] Filed: Sep. 12, 1996

[30] Foreign Application Priority Data

Nov. 28, 1995 [WO] WIPO .................. PCT/IB95/01068

[51] Int. Cl.[7] .................. H01L 35/24; H01L 51/00; H01L 33/00; H01L 1/62
[52] U.S. Cl. .................. 257/40; 257/103; 313/504; 313/506; 428/917
[58] Field of Search .................. 257/40, 103; 313/504, 313/506; 428/917

[56] References Cited

U.S. PATENT DOCUMENTS

| | | | |
|---|---|---|---|
| 5,093,698 | 3/1992 | Egusa | 357/17 |
| 5,559,400 | 9/1996 | Nakayama et al. | 313/506 |
| 5,652,067 | 7/1997 | Ito et al. | 428/917 |
| 5,674,597 | 10/1997 | Fujii et al. | 428/917 |
| 5,756,224 | 5/1998 | Börner et al. | 48/917 |

*Primary Examiner*—Brian Dutton
*Attorney, Agent, or Firm*—Gunster, Yoakley, Valdes-Fauli & Stewart, P.A.

[57] ABSTRACT

The above objects have been accomplished by providing an OLED having an organic active (53) region with at least one emission layer (EL). The OLED further comprises at least one organic charge transport layer (52) (either a hole transport layer or an electron transport layer), an anode (51) and a cathode (54). This organic charge transport layer (52) is alloyed by introduction of an inorganic component. If said alloyed charge transport layer (52) is a hole transport layer (HTL), for example, the holes are conducted through it by means of the inorganic constituents with reduced voltage drop or heating.

24 Claims, 13 Drawing Sheets

ORGANIC/INORGANIC ALLOYS USED TO IMPROVE ORGANIC ELECTROLUMINESCENT DEVICES

TECHNICAL FIELD

The present invention pertains to organic electroluminescent devices, arrays, displays and methods for making the same.

BACKGROUND OF THE INVENTION

Organic electroluminescence has been studied extensively because of its possible applications in discrete light emitting devices, arrays and displays. Organic materials investigated so far can potentially replace conventional inorganic materials in many applications and enable wholly new applications. The extremely high degree of freedom in organic synthesis promises even more exciting materials in the near future.

Organic electroluminescence at low efficiency was observed many years ago in metal/organic/metal structures as, for example, reported in Pope et al., Journal Chem. Phys., Vol. 38,1963, pp. 2024, and in "Recombination Radiation in Anthracene Crystals", Helfrich et al., Physical Review Letters, Vol. 14, No. 7,1965, pp. 229–231. Recent developments have been spurred largely by two reports of high efficiency organic electroluminescence. These are C. W. Tang et al., "Organic electroluminescent diodes", Applied Physics Letters, Vol. 51, No. 12,1987, pp. 913–915, and Burroughs et al., Nature, Vol. 347, 1990, pp. 539. Each utilized transparent ITO (Indium-Tin-Oxide) and metal/glass as substrate. Tang et al. made two-layer organic light emitting devices using vacuum deposited monomeric compounds while Burroughs used spin coated poly(p-phenylenevinylene) (PPV), a polymer.

The advances described by Tang and Burroughs were achieved mainly due to improvements in the design of electroluminescent devices through the selection of appropriate organic multilayers and contact metals. Tang showed that a two-layer structure offers great advantage because, in general, an organic material does not conduct both electrons and holes equally well. A given organic material is usually best suited for only light emission with high efficiency, or for charge transport of one polarity, or for efficient charge injection from a metal contact into the particular organic material. This trend is demonstrated in "Electroluminescence in Organic Films with Three-Layer Structure", C. Adachi et al., Japanese Journal of Applied Physics, Vol. 27, No. 2, 1988, pp. L269–L271 and in "Organic Electroluminescence Devices with a Three-Layer Structure", C. Adachi et al., Japanese Journal of Applied Physics, Vol. 27, No. 4, pp. L713–L715. In these reports, Adachi introduced three-layer structures which separate electron conduction, hole conduction and emission, such that each organic material performed only a single function.

Organic electroluminescent light emitting devices (OLEDs) function much like inorganic light emitting diodes (LED). The simplest possible structure, schematically illustrated in FIG. 1A, consists of an organic emission layer 10 sandwiched between two electrodes 11 and 12 which inject electrons (e-) and holes (h+), respectively. Such a structure has been described in the above mentioned paper of Burroughs et al., for example. The electrons and holes meet in the organic layer 10 and recombine producing light. Improved performance can be achieved when the electrode materials are chosen to match the electron and hole bands of the organic material forming the organic layer 10. Such an improved structure is shown in FIG. 1B. By choosing the right electrode materials 13 and 14, the energy barriers to injection of carriers are reduced, as illustrated. Still, such simple structures perform poorly because nothing stops electrons from traversing the organic layer 10 and reaching the anode 14, or vice versa. FIG. 2A illustrates a device with a large electron barrier 16 such that few electrons are injected, leaving the holes no option but to recombine in the cathode 15. A second problem, shown in FIG. 2B, is that the mobilities of electrons and holes in most known organic materials, especially the conductive ones, differ strongly. FIG. 2B illustrates an example where the holes injected from the anode 18 quickly traverse through the organic layer 19, while the injected electrons move much slower, resulting in recombination near the cathode 17. If the electron mobility in the organic layer 19 were larger than the holes', recombination would occur near the anode 18. Recombination near a metal contact is strongly quenched by the contact which limits the efficiency of such flawed devices.

Tang, as shown in FIG. 3A, separated electron and hole transport functions between two materials mainly to overcome the problems described above, introducing an electron transport layer 20 (ETL) and a hole transport layer (HTL) 21. In "Electroluminescence of doped organic thin films", C. W. Tang et al., Journal of Applied Physics, Vol. 65, No. 9, 1989, pp. 3610–3616, it is described that higher carrier mobility was achieved in the two-layer design, which led to reduced device series resistance enabling equal light output at lower operating voltage. The contact metals 22, 23 could be chosen individually to match to the ETL 20 and HTL 21 bands, respectively, while recombination occurred at the interface 24 between the organic layers 20 from either electrode 22, 23. The structure of FIG. 3A blocks electrons from entering the HTL 21 and vice versa by a clever choice of HTL and ETL materials. This feature eliminates non-radiative recombination at the metal contacts as described in FIG. 1A and also promotes a high density of electrons and holes in the same volume leading to enhanced radiative recombination. It was also first disclosed by Tang et al. in this paper that the organic emission layer can be doped with another organic compound, in this case courmarin 540 dye or DCM compounds, to improve the OLED efficiency or alter its emission spectrum. Tang et al. showed that with the proper selection of the organic dopant and host material, recombination is controlled by the dopant.

The structure of preference now has three organic layers, as for example described in "Electroluminescence in Organic Films with Three-Layer Structure", C. Adachi et al., Japanese Journal of Applied Physics, Vol. 27, No. 2, 1988, pp. L269–L271, and in "Electroluminescent Mechanism of Organic Thin Film Devices", C. Adachi et al., 5th International Workshop on Electroluminescence, Helsinki 1990, ACTA Polytechnica Scandinavica, Applied Physics Series No. 170, pp. 215–218. Such a emission layer 30 sandwiched between an ETL 31 and HTL 32, as shown in FIG. 3B. The three-layer structure is partly motivated by the work of F.F. So et al. who showed in their article "Evidence for Excitation Confinement in Crystalline Organic Multiple Quantum Wells", Physical Review Letters, Vol. 66, No. 20, May 20 1991, pp. 2649–2652, that the quantum-well concept is just as valid for organic electroluminescent materials as inorganic semiconductors. The three-layer structure benefits from the confinement of both electrons and holes in the active layer where they can recombine most efficiently. A further advantage is increased specialization of the layers. In two-layer structures, one material must perform both transport and emission necessitating a compromise, whereas the three-layer structure permits the transport and active layers to be chosen exclusively on their conduction and emissive properties, respectively.

Organic LEDs have great potential to outperform conventional inorganic LEDs in many applications. One important advantage of OLEDs and devices based thereon is the price since they can be deposited on large glass substrates, or a wide range of other inexpensive transparent, semitransparent or even opaque substrates at low temperature, rather than on crystalline substrates of limited area at high temperature as is the case for inorganic LEDs. The substrates may even be flexible enabling flexible OLEDs and new types of displays. To date, the performance of OLEDs and devices based thereon is vastly inferior to inorganic ones for several reasons:

High operating voltage: Organic devices require more voltage to inject and transport the charge to the active region (emission layer) which in turn lowers the power efficiency of such devices. High voltage results from the need for high electric fields to inject carriers over energy barriers at the metal/organic interfaces, and from the low mobility of the carriers in the organic transport layers (ETL and HTL) which leads to a large ohmic voltage drop and power dissipation.

Low brightness: Today's OLEDs can produce nearly as many photons per electron as inorganic LEDs, i.e. their quantum efficiency is good. OLEDs lag inorganic LEDs in brightness for the simple reason that comparatively little charge can be conducted through the resistive transport layers (HTL or ETL). This well known effect is referred to as Space Charge Limited Current. Simply put, due to the low mobility of carriers in organic materials, a traffic jam develops which restricts the flux of electrons and holes reaching the emission layer. Better emitter materials cannot offer greatly improved brightness until high conductance transport layers are available.

Reliability: Organic LEDs degrade in air and during operation. Several problems are known to contribute.

A) Efficient low field electron injection requires low work function cathode metals like Mg, Ca, F, Li etc. which are all highly reactive in oxygen and water. Ambient gases, and gases coming out of the organic materials during ohmic heating degrade the contacts.

B) Conventional AgMg and ITO contacts still have a significant barrier to carrier injection in known ETL and HTL materials. Therefore, a high electric field is needed to produce significant injection current. This stress from the high field and ohmic heating at the resistive interface contribute to device degradation.

C) The high resistance of conventional carrier transport layers heats the device under operation.

D) Thermal stability of most OLED materials is poor making them sensitive to heating. Upon heating, many amorphous organic materials crystallize into grains. The crystallites have less volume and pack less uniformly than the amorphous solid. The resulting gaps and odd shapes of the crystallites make conduction from one crystallite to the next difficult, increasing resistance and heating in a positive feedback loop, while opening further channels for gaseous contaminants to penetrate, or for neighboring materials to diffuse.

Even the three-layer organic structure (see for example FIG. 3B), requires the transport layers to perform two tasks, charge injection and carrier transport, although they may only be optimized for one task. A natural improvement is a five-layer structure in which two injection layers are added. These new layers would be useful if they split the energy offset between the contact metals and the transport layers. For electrons and holes it is much easier to overcome two small barriers than a single barrier whose height is the sum of the two smaller barriers. Part of an OLED device, in which two smaller barriers are provided, is illustrated in FIG. 4. This device comprises a cathode metal 41 followed by an electron injection layer 40 and an electron transport layer (ETL) 42. The work functions of these three layers 40-42 are chosen such that two small energy steps for electrons replace the larger one which would exist between the cathode and ETL alone. The same applies to holes, too. This enables the injection layer to be chosen for its work function and the transport layer for its mobility.

OLEDs are mainly limited by their contacts and transport layers, not their emission layers. It is thus highly desirable to replace the low work function metals with stable materials that can easily inject charge into the OLED.

While organic materials are highly efficient emissive materials, they are very poor electrical conductors, having both poor mobility and low carrier concentrations. An example of this is Alq3 (tris(8-hydroxyquinoline aluminum)) the most popular electron transport material for OLEDs today. Kepler et al. in "Electron and hole mobility in tris(8-hydroxyquinoline aluminum)" Applied Physics Letters, Vol. 66, No. 26, 1995, pp. 3618–3620, measured the mobilities of electrons and holes in Alq3, obtaining values of $1.4 \times 10^{-6}$ and $2 \times 10^{-8}$ cm$^2$/Vs, respectively. In comparison, amorphous Silicon (Si) deposited on glass, such as is commonly used in solar cells and thin film transistors, has mobilities six orders of magnitude higher, i.e. ~1cm$^2$/Vs. Inorganic metals also have low mobilities, but this is compensated by the huge carrier concentrations which participate in charge conduction. E.g., metals have typical resistivities on the order of $10^{-6}$ Ohm cm or below. Doped semiconductors can be resistivities as low as $10^{-3}$ to $10^{-4}$ Ohm cm. On the other hand, organic conductors (which could otherwise be referred to as insulators), have typical resistivities on the order of $10^6$ Ohm cm or more. It therefore makes sense to let each material do what it does best. Polymeric and monomeric materials have different properties which reflect in the performance of OLEDs made from each. This makes devices using both attractive. For example, C. C. Wu et al. reported in their article "Poly(phenylene vinylene)/tris(8-hydroxy) quinoline aluminum heterostructure light emitting diode", Applied Physics Letters, Vol. 66, No. 6, 1995, pp. 653–655, that they used both organic polymer and monomeric layers to form a device. Polymers, having greater molecular weights, do not crystallize like common HTL materials. The disadvantage of this approach is that two different fabrication techniques are required. The delay, transfer etc. introduces contaminants at the interface. J. Kido et al. doped a polymer with monomers, as described in "Organic electroluminescent devices based on molecularly doped polymers", Applied Physics Letters, Vol. 61, No. 7, 1992, pp. 761–763. These approaches do not solve the problems with OLEDs identified above.

S. Tokito et al. described in the article "Organic electroluminescent devices fabricated using a diamine doped MgF$_2$ thin film as a hole-transporting layer", Applied Physics Letters, Vol. 66, No. 6, 1995, pp. 673–675 a device having an inorganic layer doped with organic components. Their motivation was to avoid recrystallization of the diamine. Their inorganic material, MgF$_2$, is an insulator, such that all of the hole conductivity was contributed by the organic component introduced.

Other groups have reported inorganic/organic hybrid devices realized by integrating distinct organic layers with inorganic layers. Examples are M. Era et al., "Organic-Inorganic heterostructure electroluminescent device using a layered perovskite semiconductor $(C_6H_5C_2H_4NH_3)_2PbI_4$", Applied Physics Letters, Vol. 65, No. 6, 1994, pp. 676–478. The device of Era et al. used an inorganic perovskite as both the HTL and emission layer, together with an organic oxidiazole ETL. Fujita et al. used n-type epitaxial ZnSe/GaAs as both the ETL and emission layer, together with an organic diamine HTL. The device of Era et al. had poor efficiency because of the poor optical quality of the perovskite active layer. It also suffers from many of the disadvantages of conventional OLEDs in that the ETL conductivity is poor and an unstable cathode metal is needed. The approach of Fujita et al. has none of the desirable properties of OLEDs with respect to conventional inorganic LEDs. The epitaxial ZnSe/GaAs approach is difficult and expensive and limited to small areas by the GaAs substrate. Both the anode and the GaAs substrate strongly absorb the blue light emitted by the ZnSe reducing the light output. Furthermore, the diamine HTL conducts holes much more poorly than many p-type inorganic semiconductors.

As seen from the above, OLEDs, to function best, must solve two problems: efficient recombination and efficient charge transfer from the anode/cathode into the emissive organic material. An ETL and HTL are needed to remove the active region from the quenching contacts for efficient recombination. Low work function cathode metals are the method of choice for efficient charge transfer, since all known electron conducting organics also have low work functions.

However, each of these solutions inhibits performance and degrades device reliability. The price of removing the active layer from the metal contacts for better recombination efficiency are ohmic voltage drops across the HTL/ETL, leading to heating and power consumption. Low work function metals are unstable and unreliable.

As can be seen from the above examples and the description of the state of the art there are two main problems which must be solved to realize OLEDs and displays based thereon with acceptable characteristics.

It is an object of the present invention to provide new and improved organic electroluminescent devices, arrays and displays based thereon.

It is a further purpose of the present invention to provide new and improved organic electroluminescent devices, arrays and displays based thereon with improved efficiency, lower operating voltage, higher brightness and increased reliability.

It is a further object to provide a method for making the present new and improved organic electroluminescent devices, arrays and displays.

SUMMARY OF THE INVENTION

The above objects have been accomplished by providing an OLED having an organic active region with at least one emission layer (EL). The OLED further comprises at least one organic charge transport layer (either a hole transport layer or an electron transport layer), an anode and a cathode. This organic charge transport layer is alloyed by introduction of an inorganic component. If said alloyed charge transport layer is a hole transport layer (HTL), for example, the holes are conducted through it by means of the inorganic constituents with reduced voltage drop or heating.

The inventive approach, which capitalizes on the high conductivities of the inorganics introduced into organic transport layers, is the exact opposite of the approach of S. Tokito et al. described in the article "Organic electroluminescent devices fabricated using a diamine doped $MgF_2$ thin film as a hole-transporting layer", Applied Physics Letters, Vol. 66, No. 6, 1995, pp. 673–475. It has also not been recognized by Tokito et al. that there is a scheme needed to improve the contacts by reducing or eliminating the energy barrier for carrier injection.

In addition to the fact that at least one of the transport layers shall be an organic/inorganic alloy layer, it may be advantageous to have another layer suited for transferring the charge from the inorganic alloy into the organic active region. According to the present invention this is achieved by providing an organic buffer layer between the active region on one side and the organic/inorganic alloy transport layer on the other side. Radiative recombination of electrons and holes in the emission layer thus occurs uninfluenced by the organic/inorganic alloy layer nearby, which otherwise would in some cases quench it. In these cases the buffer layer must be thin enough that carriers can either diffuse into the active region or be driven by a small voltage. On the other hand, the buffer layer should be thick enough to avoid quenching of the recombination by the alloy. The thickness of the organic buffer layer should be in the range of 1 nm to 100 nm, depending on how much the specific alloy degrades luminescence and on many other parameters.

In another embodiment of the present invention, both transport layers are alloyed and, in addition, one of these alloyed transport layers may be separated from the active region by an organic buffer layer.

It is also advantageous to have a symmetric device structure where on both sides of the emission layer an organic buffer layer and organic/inorganic alloy layer are provided.

Furthermore, a diffusion barrier, either organic or inorganic, might be inserted between the buffer and the alloy layer to inhibit diffusion between the alloy layer and the buffer and active layers.

The alloy concentration of the organic/inorganic alloy layer(s) might be graded such that the concentration decreases or increases with distance from the organic active region.

In order to obtain such an organic/inorganic alloy, the inorganic components are dispersed in an organic matrix such that the conductivity of the inorganic dominates without disturbing the overall nature of the organic matrix. The organic matrix forming a transport layer can either be alloyed by introducing one inorganic component or by introducing different inorganic components. The electron transport layer may be alloyed using other inorganic materials than those used for alloying the hole transport layer.

The inorganic can be selected for either its high mobility or high carrier concentration relative to organic materials. Either choice will result in higher current and lower resistance at a given drive voltage, or equal current at a lower voltage.

The introduction of an organic/inorganic alloy as transport layer leads to the following three advantages:

Charge injection now can occur between the inorganic contact material and the inorganic component(s) of the organic/inorganic alloy transport layer. The problem of injecting the charge thus is well understood (e.g. metal/semiconductor), and is easily optimized with chemically stable materials using conventional approaches as is elaborated later.

The transfer of carriers from the electrode to the emission region (active region) is improved because of either the high mobility or high carrier concentration of the inorganic components in the organic matrix.

Charge transfer no longer occurs at the electrode/transport layer interface(s), rather within the device. This is highly desirable for two reasons. 1) The alloy microstructure, consisting of dispersed inorganic component(s) within the organic matrix dictates that the inorganic regions will have sharper average feature sizes. At a given operating voltage, sharper features in the conductive inorganic compound(s) correlate directly with increased local electric fields at the inorganic/organic interface resulting in more efficient charge transfer. 2) The dispersed nature of the alloy also produces a drastically higher total contact area between the inorganic and organic compounds. At a given electric field or voltage, the total current is directly proportional to the contact area participating in injection. The advantages are significant when compared to the conventional approach in which the organic/inorganic junction is an extremely smooth interface between two flat layer surfaces.

The use of organic/inorganic alloys also enables OLED structures to be designed thicker to make them more robust and contamination tolerant. Designers of conventional OLEDs are forced to make a tradeoff between series resistance and device reliability. Specifically, in order to minimize ohmic heating and power dissipation, they would like to make the transport layers as thin as possible. They cannot do so because making them to thin would expose the device to quenching of electroluminescence by the contact metals, higher electrical fields at device operating voltages, and to short circuiting caused by particle contamination. The latter effect can be seen using the example of a 100 nm metal contaminant particle. It may completely disrupt a 75 nm thick OLED because it is not fully covered by the organic layers and is able to conduct directly between the anode and cathode electrodes causing a catastrophic short circuit. On the other hand, a 250 nm thick device will completely engulf the metal particle with primarily organic layers so that the topmost metal does not have a direct path to the metal beneath. Organic/inorganic alloying, by improving the transport layer conductivity drastically, enables thicker OLEDs to be designed.

There are four distinct practical possibilities for alloyed transport layer/contact interfaces, dependent on the choice of a metal or semiconductor. In each case, inorganic materials can be selected on both sides of the interface which are stable, reliable, and inject charge readily with negligible ohmic losses.

1) Metal inorganic alloy component/metal contact: No barrier to carrier injection of either polarity can arise regardless of work function. For example, Al and Au, whose work function differ nearly as widely as any two metals', exhibit no barrier to electron transport in either direction because each of their conduction bands are only partially occupied.

2), 3) Semiconductor inorganic alloy component/metal contact or metal inorganic alloy component/semiconductor contact: Metal/semiconductor junctions, i.e. Schottky diodes, have been widely studied and are well understood. They present a barrier to charge flow in both directions making these two cases roughly equivalent. The amount of current which can pass at a given junction voltage is a function of both the Schottky barrier height (determined by the physics of the interface) and the barrier width (determined by the carrier concentration in the semiconductor).

In fact, the transport layer/contact junctions in conventional OLEDs are Schottky diodes in which the barrier height is determined by the work functions of the two materials and the width by the barrier concentration of the organic transport layer. Organic materials, which cannot be electrically doped, have very low native carrier concentrations causing wide barriers which prohibit tunneling at moderate voltages. Therefore, charge injection in conventional OLEDs is primarily dictated by the work function difference between the metal and organic. Inorganic semiconductors can be doped, often quite heavily, to produce thin barriers which permit large tunneling currents, even in the presence of large overall barrier heights. Even undoped inorganic semiconductors at room temperature have higher intrinsic carrier concentrations than organic compounds leading to comparatively thinner barrier widths. Therefore, in the case that the OLED charge injection occurs between an inorganic semiconductor and a metal, significant advantages compared to conventional OLEDS result from the higher carrier concentration preferred by the inorganic semiconductor material.

4) Semiconductor inorganic alloy component/semiconductor contact: Semiconductor junctions, either homo- or heterojunctions are also we stood and are quite similar to the Schottky diode case. The barrier height is determined by the interface physics while the width is given by carrier concentrations. Homojunctions have small barrier heights equal only to differences in the Fermi energies on either side. By doping each side similarly, the barrier can be eliminated altogether. Heterojunctions between certain semiconductors can be made with no barrier to charge flow in one direction. In general, through careful selection of the semiconductors on either side and control of their doping, this type of interface will be highly efficient at charge injection.

DESCRIPTION OF THE DRAWINGS

The invention is described in detail below with reference to the following schematic drawings.

GENERAL DESCRIPTION

Figure 7A:
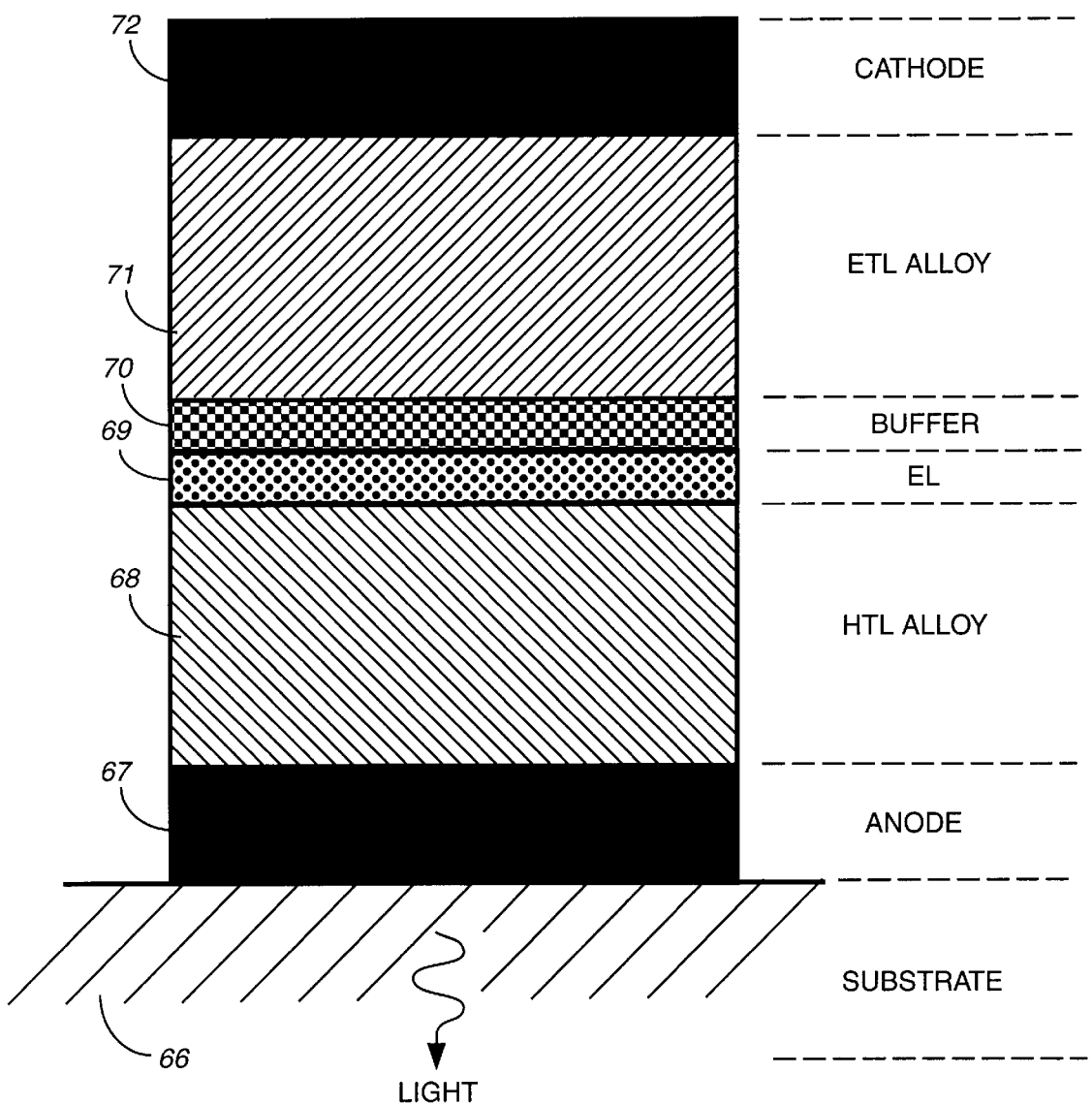
FIG. 7A shows the cross-section of a four-layer light emitting device, according to the present invention, comprising an organic/inorganic alloy layer serving as the electron transport layer, an organic buffer layer, a conventional organic emission layer, and an organic/inorganic alloy layer serving as the hole transport layer.
Figure 8A:
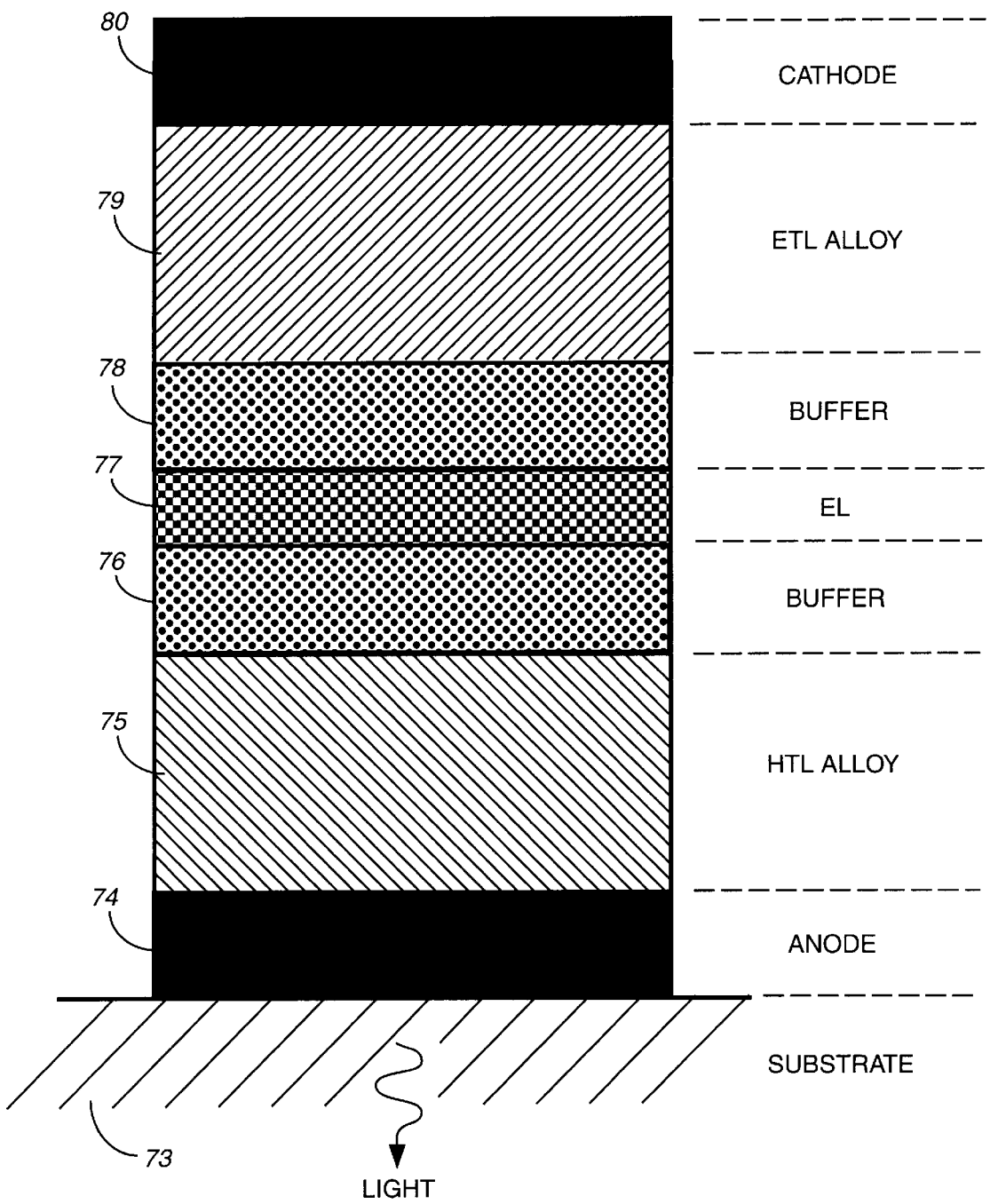
FIG. 8A shows the cross-section of a five-layer light emitting device, according to the present invention, comprised mostly of a single organic matrix doped with inorganic compound(s) in each electron and hole transport layer to promote conduction, undoped buffer layers surrounding the emission layer composed of a second organic material which may be doped with organic and/or inorganic compounds to provide emission at the desired wavelength(s).
Figure 9:
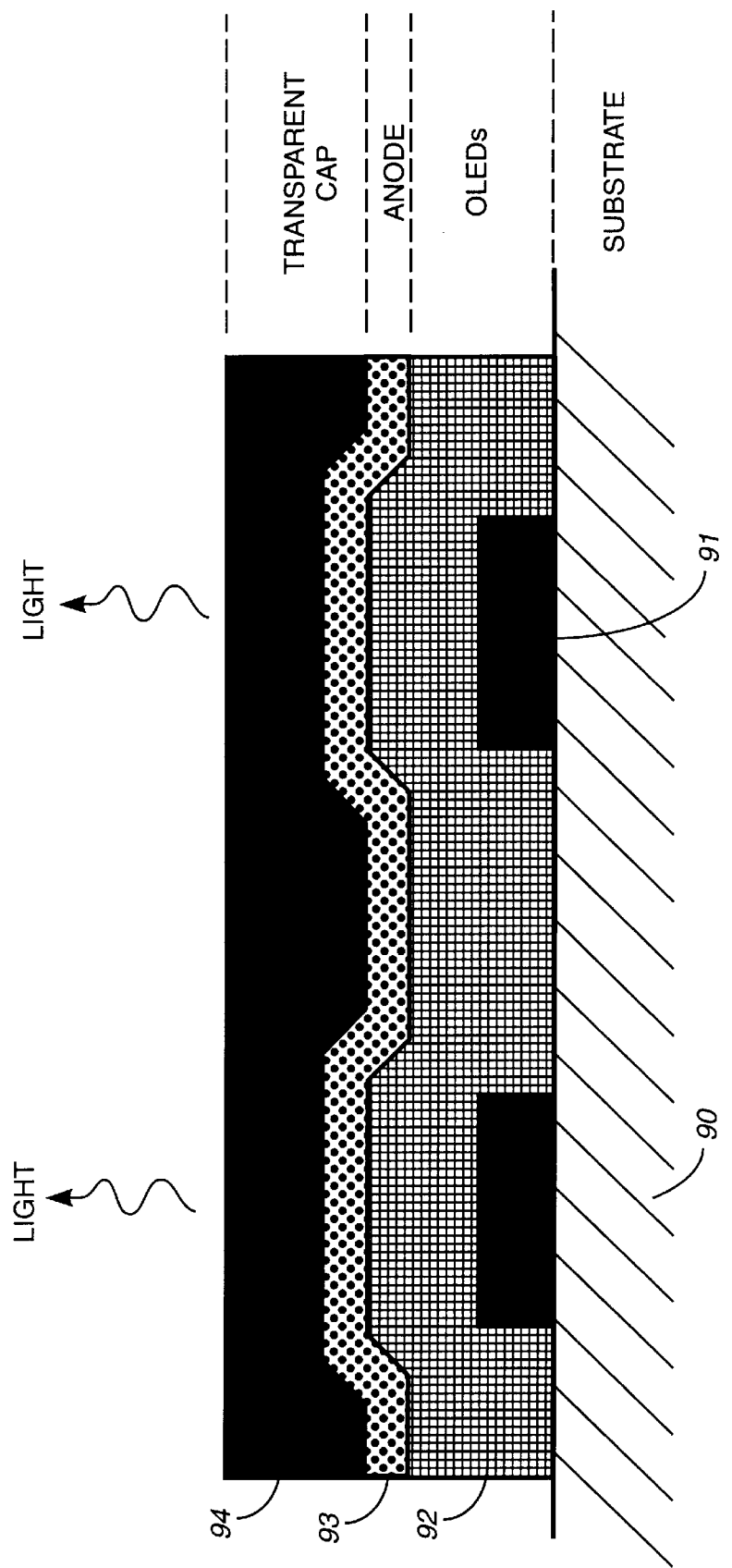
FIG. 9 shows an embodiment of the present invention realized on a Si substrate in the anode-up configuration.
Figure 10:
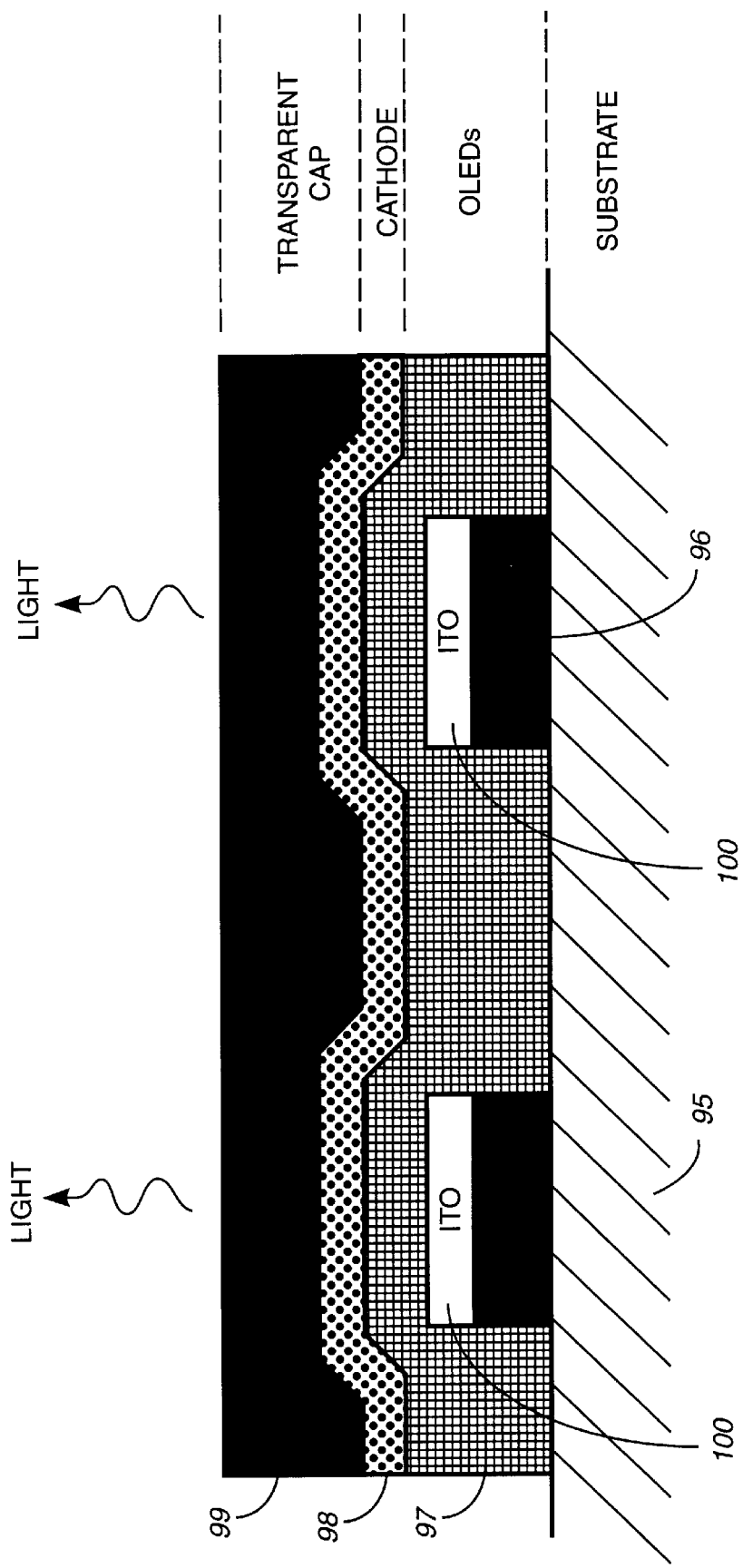
FIG. 10 shows an embodiment of the present invention realized on a Si substrate in the cathode-up configuration.
Figure 11:
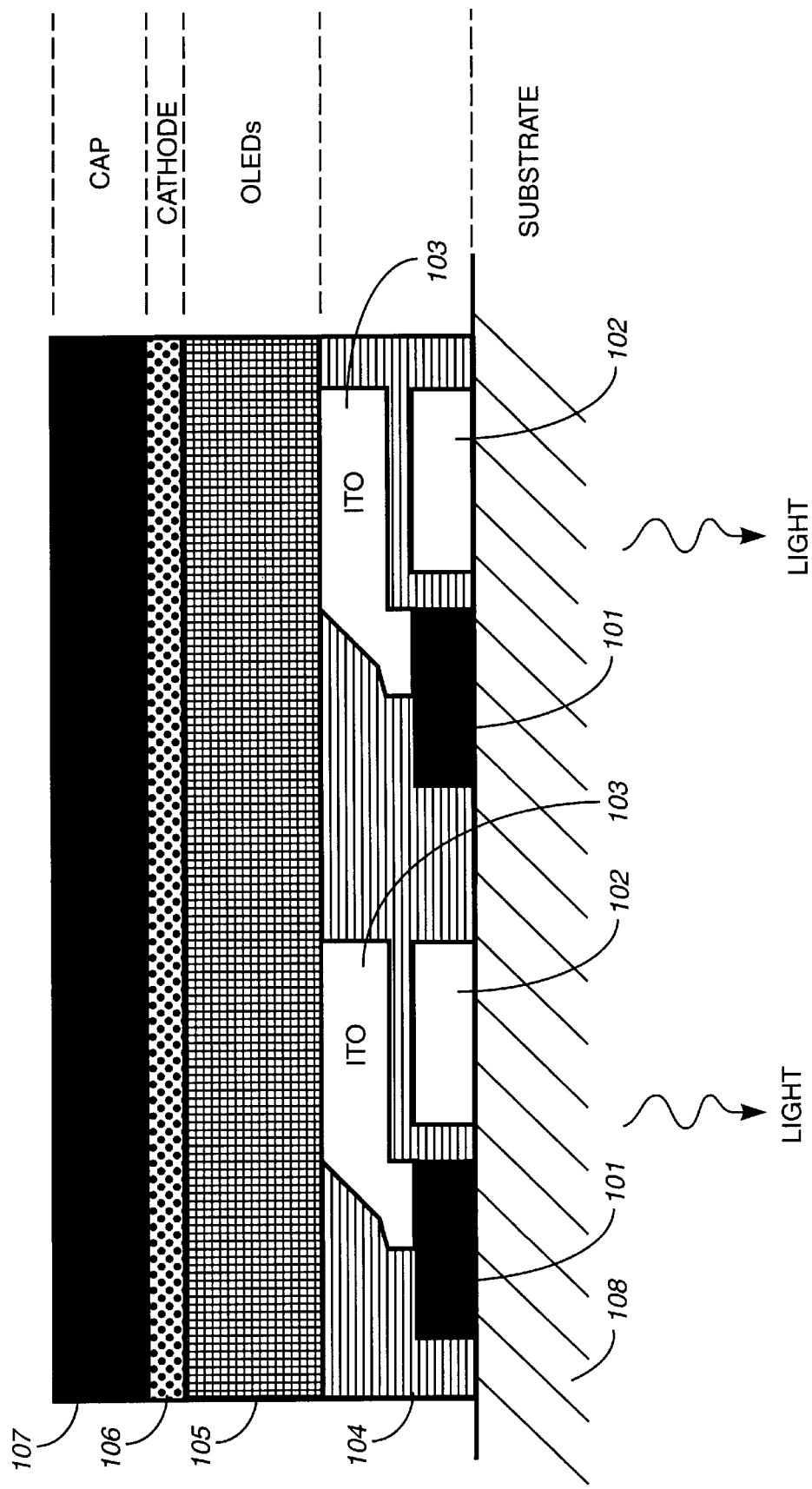
FIG. 11 shows an embodiment of the present invention, realized on a transparent substrate onto which Si devices have been patterned, in the cathode-up configuration.

In order to overcome the problems of conventional organic light emitting devices for discrete light emitters, light emitting arrays and display applications, improved structures, as illustrated in FIGS. 5, 6A, 7A, and 8A are provided, enabling new array and display applications as illustrated in FIGS. 9, 10, and 11.

The basic principle of the present invention is now detailed in connection with FIGS. 5, 6A and 6B. The idea is to use an organic/inorganic alloy layer serving as the carrier transport layer(s) instead of the conventional organic transport layer(s). If needed, such an organic/inorganic alloy layer can be separated from the organic active region where the recombination takes place by means of an organic buffer layer, or the inorganic component(s) concentration of the alloy can be graded down to low concentration near the active region.

Figure 1A:
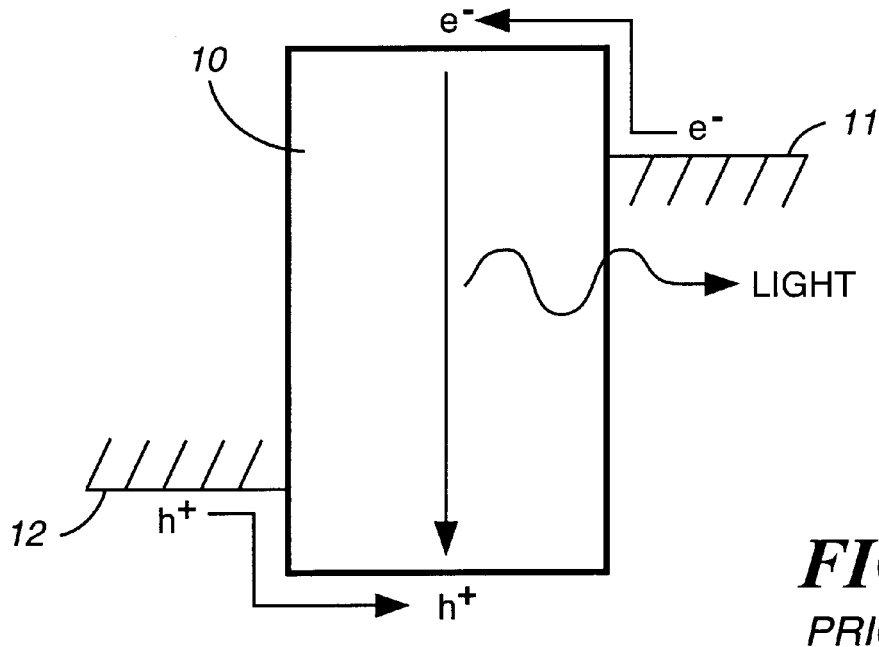
FIG. 1A shows a known OLED having an emission layer and two electrodes.
Figure 1B:
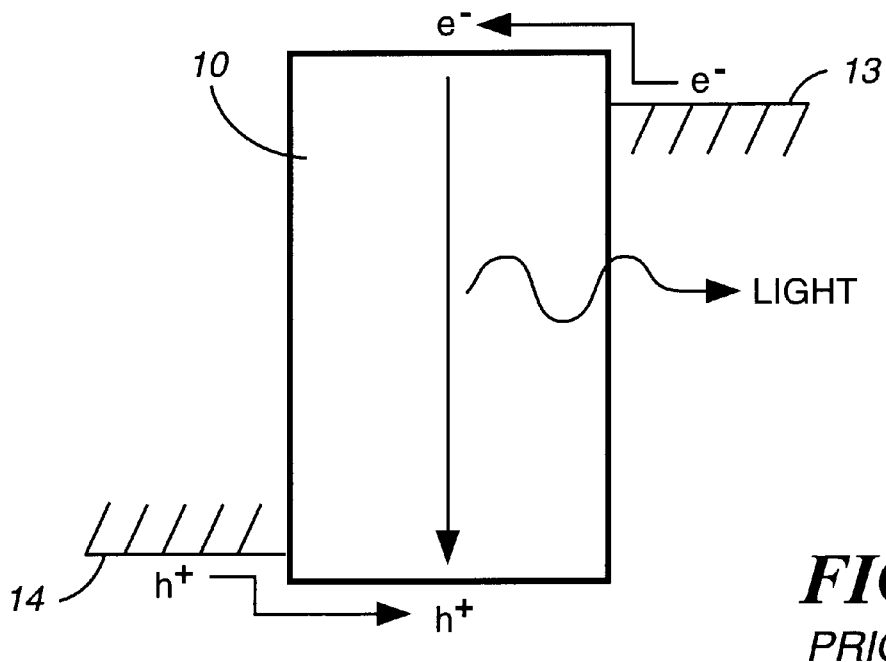
FIG. 1B shows another known OLED having an emission layer and two metal electrodes, with work functions chosen such that the energy barrier for carrier injection is reduced.
Figure 2A:
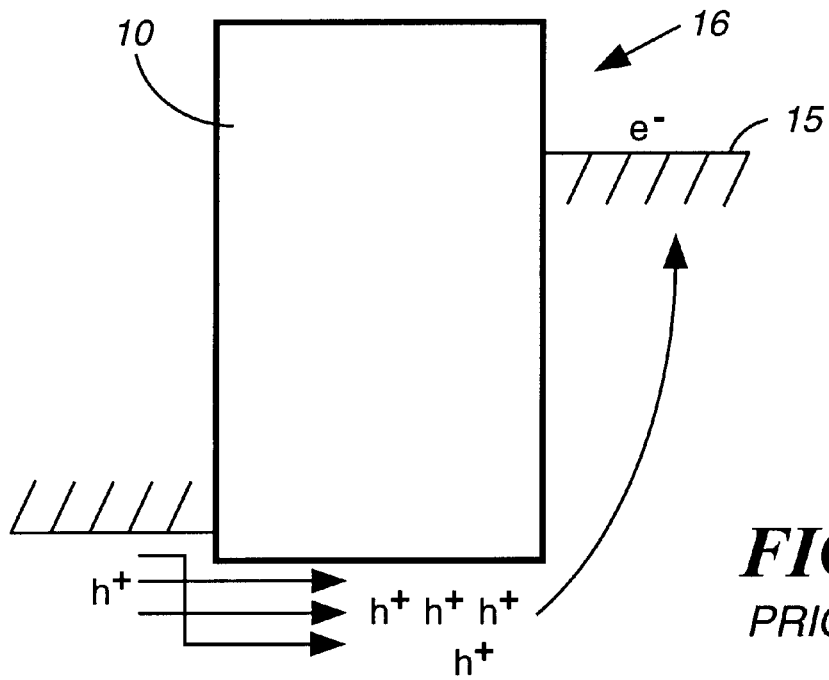
FIG. 2A shows another known OLED having an emission layer and two metal electrodes, the work function of the anode being chosen such that the energy barrier for hole injection is low, whereas the work function of the cathode poorly matches the emission layer yielding little electron injection and little radiative recombination in said emission layer.
Figure 2B:
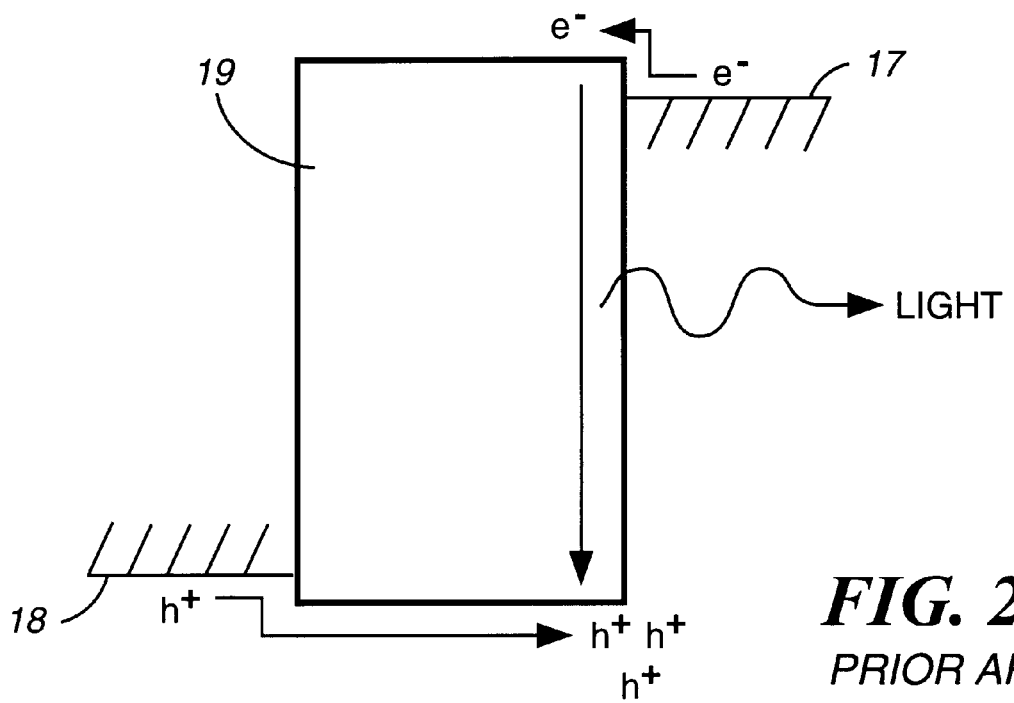
FIG. 2B shows another known OLED having an emission layer with low electron mobility compared to hole mobility such that the recombination occurs close to the cathode where it is quenched.
Figure 3A:
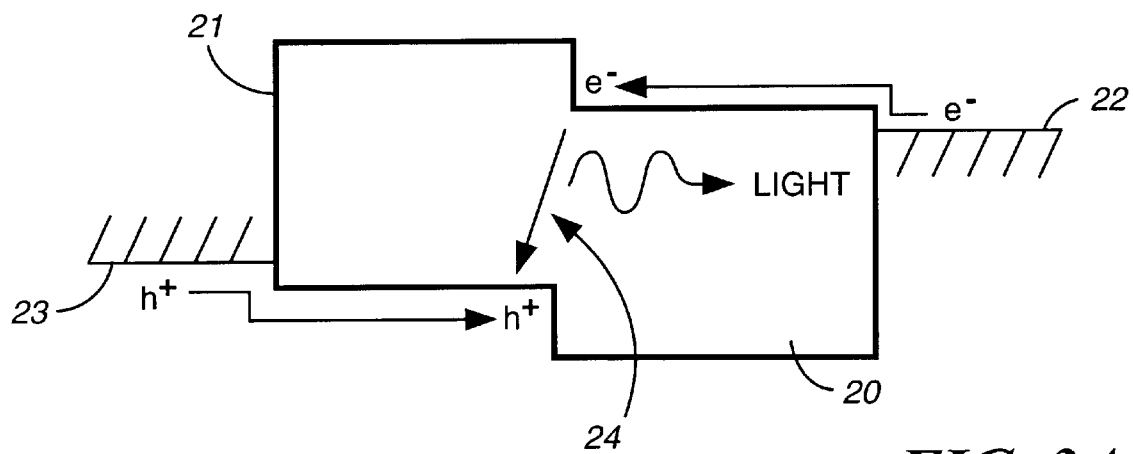
FIG. 3A shows another known OLED having an electron transport layer and hole transport layer.
Figure 3B:
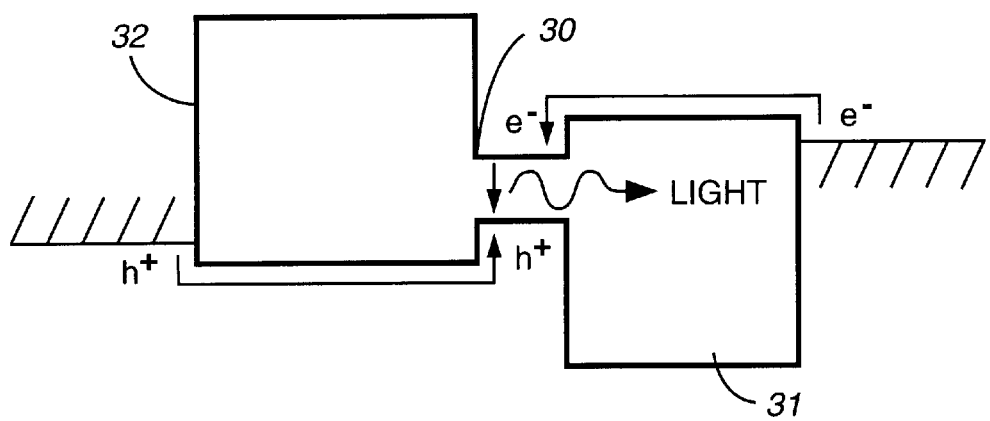
FIG. 3B shows another known OLED with three layers; an electron transport layer and hole transport layer encompassing an organic light emission layer.
Figure 4:
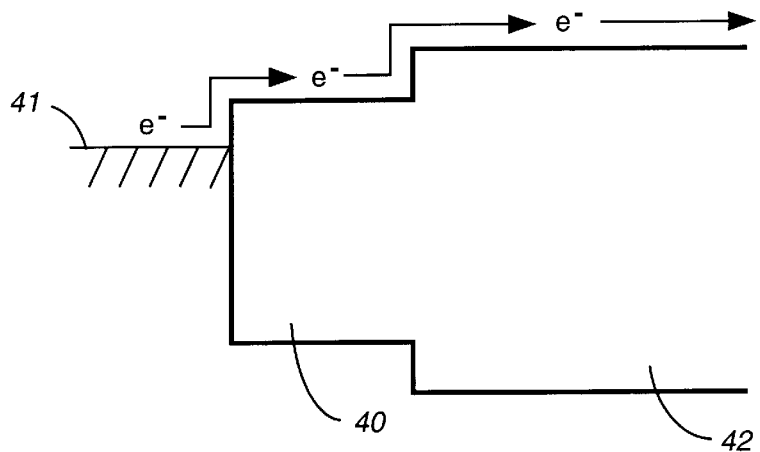
FIG. 4 shows part of another known OLED where there is an electron injection layer and an electron transport layer, the injection layer being chosen such that smaller, cascaded energy barriers occur between the contact and transport layer.
Figure 5:
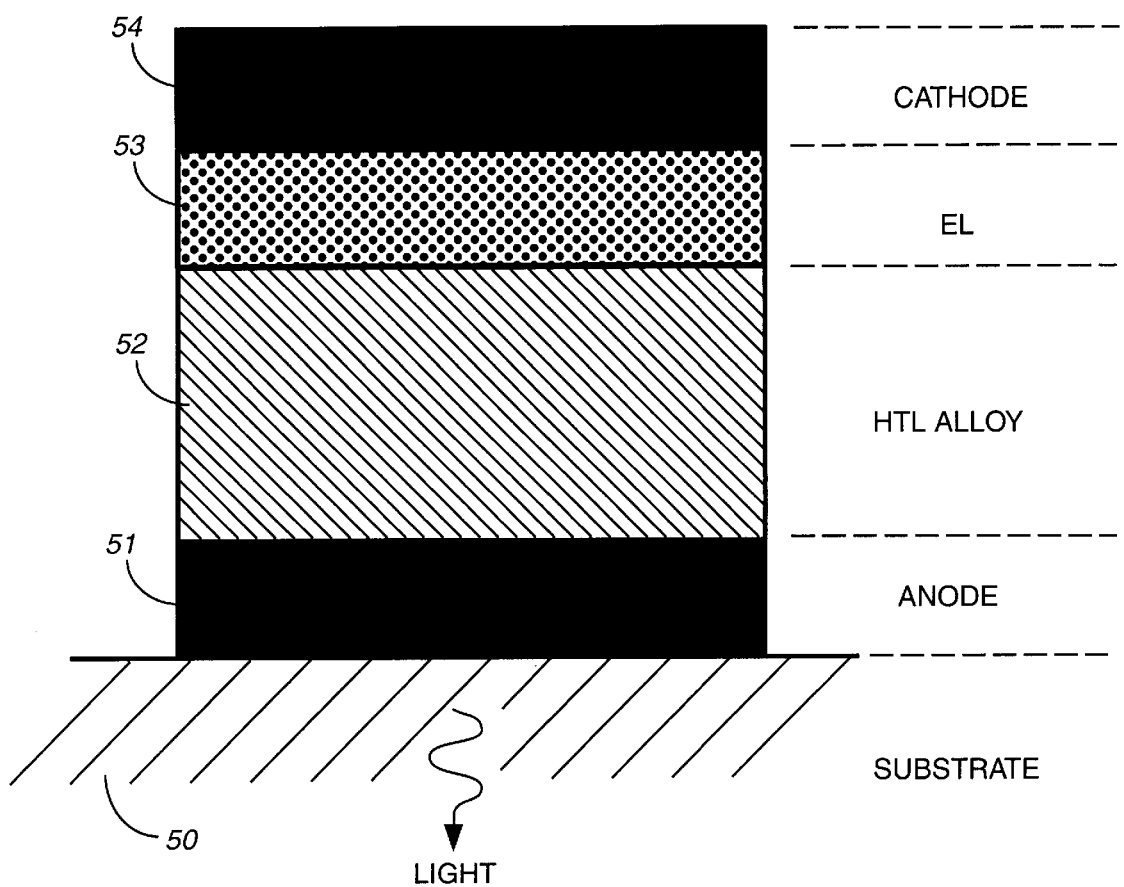
FIG. 5 shows the cross-section of a two-layer light emitting device, according to the present invention, comprising an organic/inorganic alloy layer serving as the hole transport layer and a conventional organic layer serving as the emission layer.

A first embodiment of the present invention, a two-layer light emitting device shown in FIG. 5, comprises a diamine (TAD) organic layer 52, alloyed by introduction of an inorganic component (Ge for example), which serves as hole transport layer (HTL) adjacent to an ITO anode electrode 51. On top of the organic/inorganic alloy hole transport layer 52, an Alq3 organic emission layer 53 with Al top contact 54 (cathode) are formed. This is the simplest device, already showing improved performance, due to the introduction of one alloyed transport layer.

The organic/inorganic alloy layer 52 is an organic layer comprising an inorganic component or inorganic components. The(se) component(s) are chosen such that the charge transfer into the active region or buffer layer (if any) and the conduction are optimized. It enables injection from the contacts into the inorganic component of the transport layer without a significant barrier or ohmic loss.

Figure 6A:
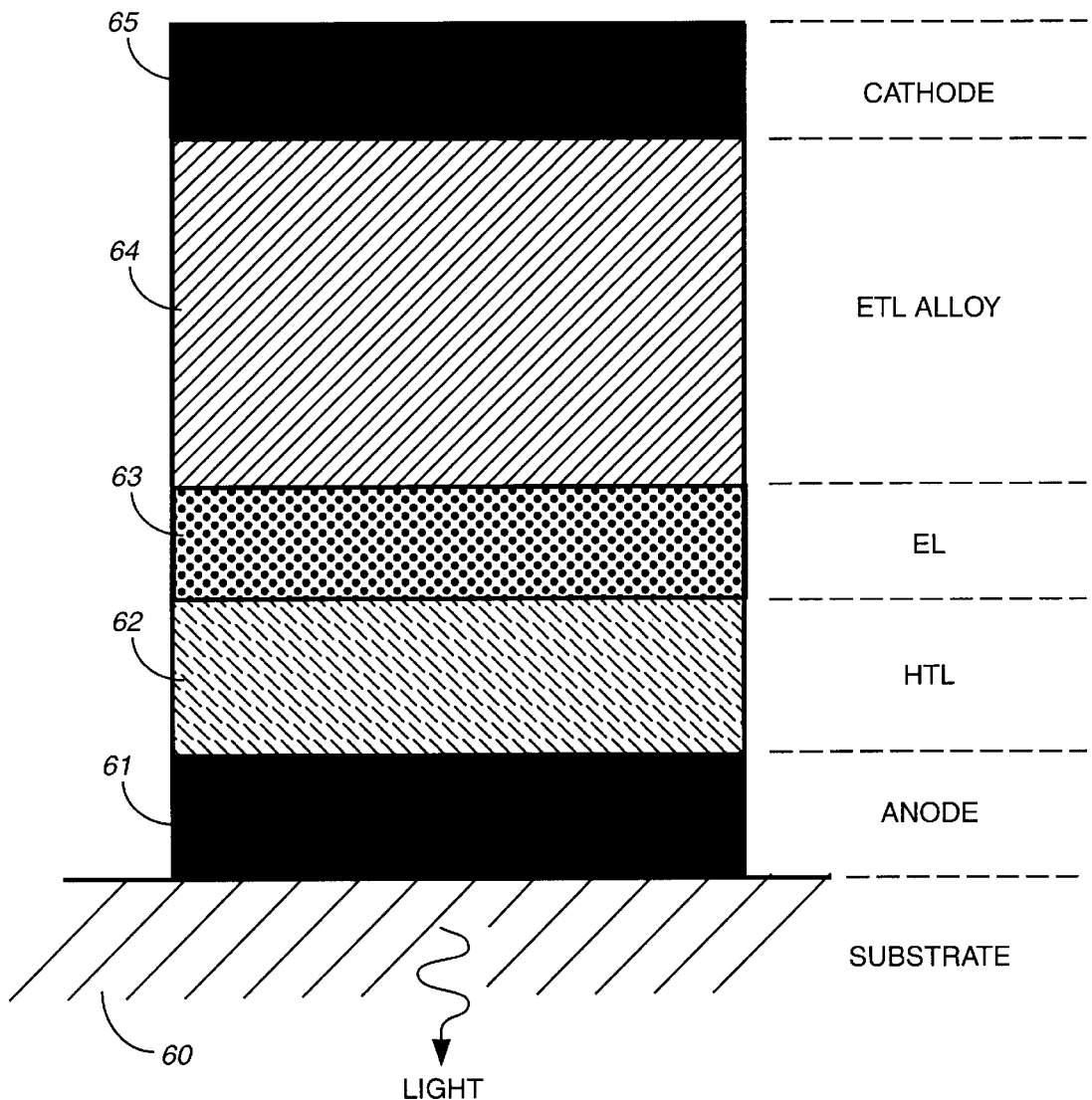
FIG. 6A shows the cross-section of a three-layer light emitting device, according to the present invention, comprising an organic/inorganic alloy layer serving as the electron transport layer, a conventional organic layer serving as the hole transport layer, and a conventional organic layer serving as the emission layer.

A second embodiment a three-layer light emitting device, is shown in FIG. 6A. In this Figure a conventional organic layer 62 serving as hole transport layer (HTL) adjacent to the anode electrode 61 and an organic/inorganic alloy layer 64 serving as electron transport layer (ETL) adjacent to the cathode electrode 65 are shown.

The organic/inorganic alloy layer 64 is an organic layer comprising an inorganic component or inorganic components, as described in connection with the first embodiment. The work function of the inorganic components of the transport layer 64 is indicated by thin, hashed lines in FIG. 6B.

In addition to the flexibility gained in choosing appropriate inorganic components to reduce the effect of, or totally remove the energy barriers between electrodes and transport layers, the inorganic component(s) assist greatly in conducting carriers through the organic/inorganic alloy layers with minimal voltage drop or device heating. The conduction of charge through the respective transport layers 62 and 64 is schematically indicated by means of solid, wave-like arrows.

Metal inorganic alloy components are distinguished by extremely large carrier densities which more than compensate for their low mobilities which are roughly equivalent to those of common organic transport materials. Semiconductors, on the other hand, have moderate carrier densities with respect to metals (though still orders of magnitude higher than common organic transport layer materials), but much higher mobilities. In both cases, the conductivity of the inorganic component is significantly higher (a factor of $10^3$–$10^{15}$) than common organic transport materials. Thus, even small inorganic alloy concentrations still lead to enormously improved transport layer conductivity.

It is further required that the electrons and holes be efficiently transferred from the organic/inorganic alloy layers to the organic active region. Here the alloy nature has the additional beneficial effect of promoting charge transfer due to the dispersed nature of the inorganic component(s) as was described in detail above.

The active region of the devices described and claimed herein may either consist of a single organic emission layer or a stack of several organic electroluminescent layers. It may also comprise one or more organic quantum well structures which confine the carriers, or a doped organic material in which the dopants (organic or inorganic) are the active recombination sites. The organic, electroluminescent active region may also comprise a stack of more than one organic layer employed to electrically confine electrons and/or holes in the active region to improve the emission of an adjacent organic layer.

Figure 6B:
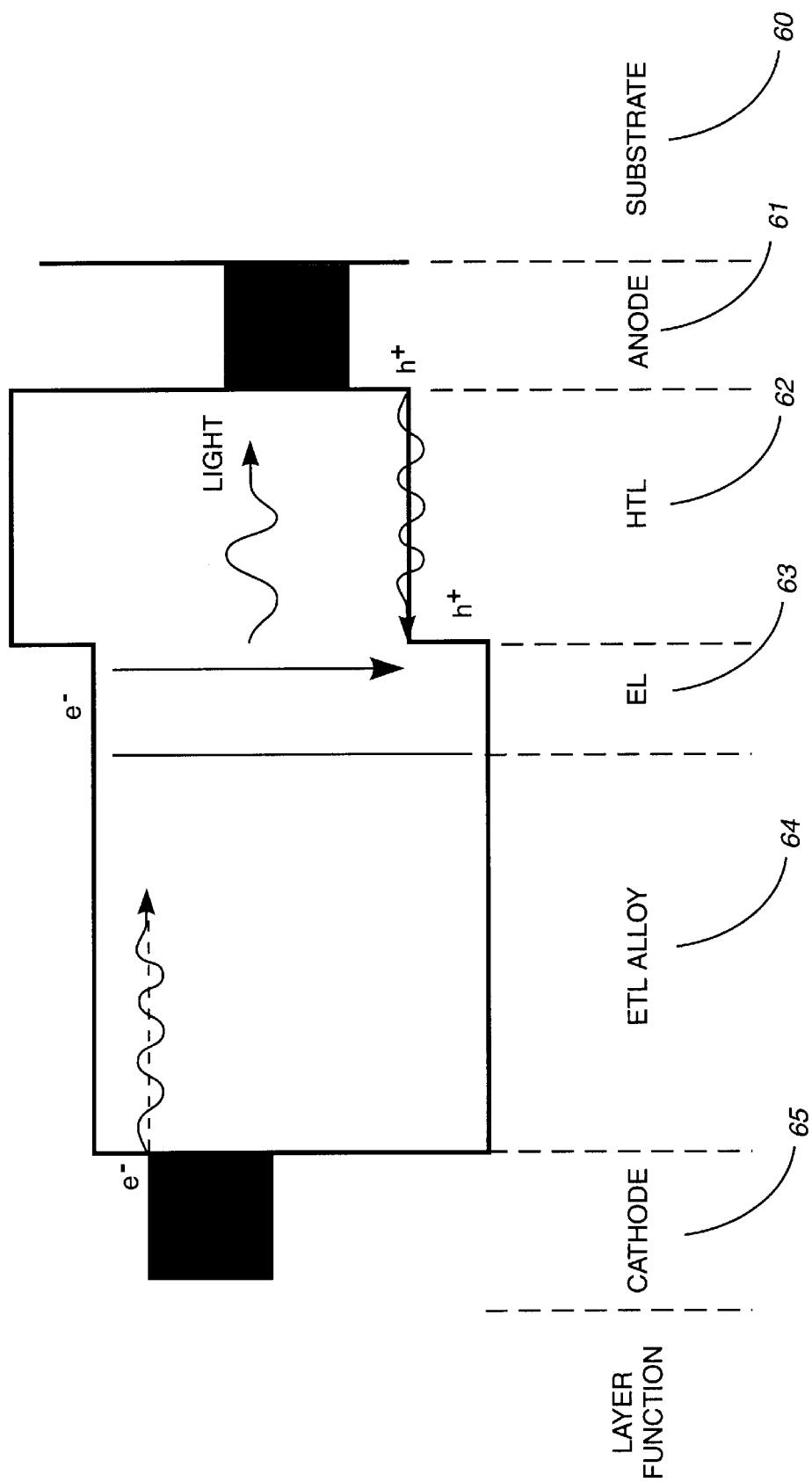
FIG. 6B shows the band diagram of the device illustrated in FIG. 6A.

In the following some more particular details of the device in FIGS. 6A and 6B are given. However, it is to be noted that most of the particulars and structural details, such as the thicknesses, organic or inorganic material choices and combinations, can be modified without deviating from the gist of the present invention. As given in Table 1, the HTL 62 comprises a common diamine (TAD). The ETL 64 comprises Alq3 as the organic host material and Aluminum (Al) as inorganic material. There is no energy barrier for electrons between ETL 64 and the stable Al cathode 65. The active layer (EL) 63 is the same organic material as the ETL 64, namely Alq3.

TABLE 1

Exemplary details of the second embodiment

| Layer | No. | Material | Width | present example | Inorganic content |
|---|---|---|---|---|---|
| substrate | 60 | glass | 0.1 mm–5 mm | 1 mm | |
| anode | 61 | ITO | 10–300 nm | 50 nm | |
| HTL | 62 | TAD | 5–500 nm | 50 nm | 0% |
| emission layer | 63 | Alq3 | 1–100 nm | 20 nm | |
| ETL alloy | 64 | Al/Alq3 | 2–1000 nm | 200 nm | 15% |
| cathode | 65 | Al | 10–2000 nm | 50 nm | |

In order to further improve the present organic light emission devices, an organic buffer layer may be formed between the active region and an alloyed transport layer. In FIG. 7A a structure is shown where such an organic buffer layer 70 is placed between the ETL 71 and active region 69. The organic buffer layer 70 mitigates influence of the alloyed ETL 71 on the recombination of carriers in the active region 69. Experiments have shown that the recombination can be quenched if an inorganic material is in close contact to the active region, e.g. in conventional devices with very thin transport layers. The organic buffer layer 70, according to the present invention, must be thin enough to avoid significant ohmic losses during transport, or to perhaps even allow diffusive transport between the transport layer and active region. It must also be thick enough to accomplish its purpose of isolating the active region from the transport layer. The actual thickness of the organic buffer layer depends on different parameters such as inorganic component(s) and organic host material of the transport layer, organic material and structure of the active region 69, and last but not least on the buffer material as such, just to mention the most important factors. A very thin organic buffer layer 70 already may drastically improve the envisaged effect by altering the growth of the active region, or by offering a diffusion barrier or electrical confinement for the active region. Thicknesses in the range of a 1 nm to 100 nm, depending on the parameters mentioned above, are reasonable. It is immediately clear that instead of providing such an organic buffer layer 70 only on one side of the active region 69, a similar one or one another type might be provided on the other side as well.

Figure 7B:
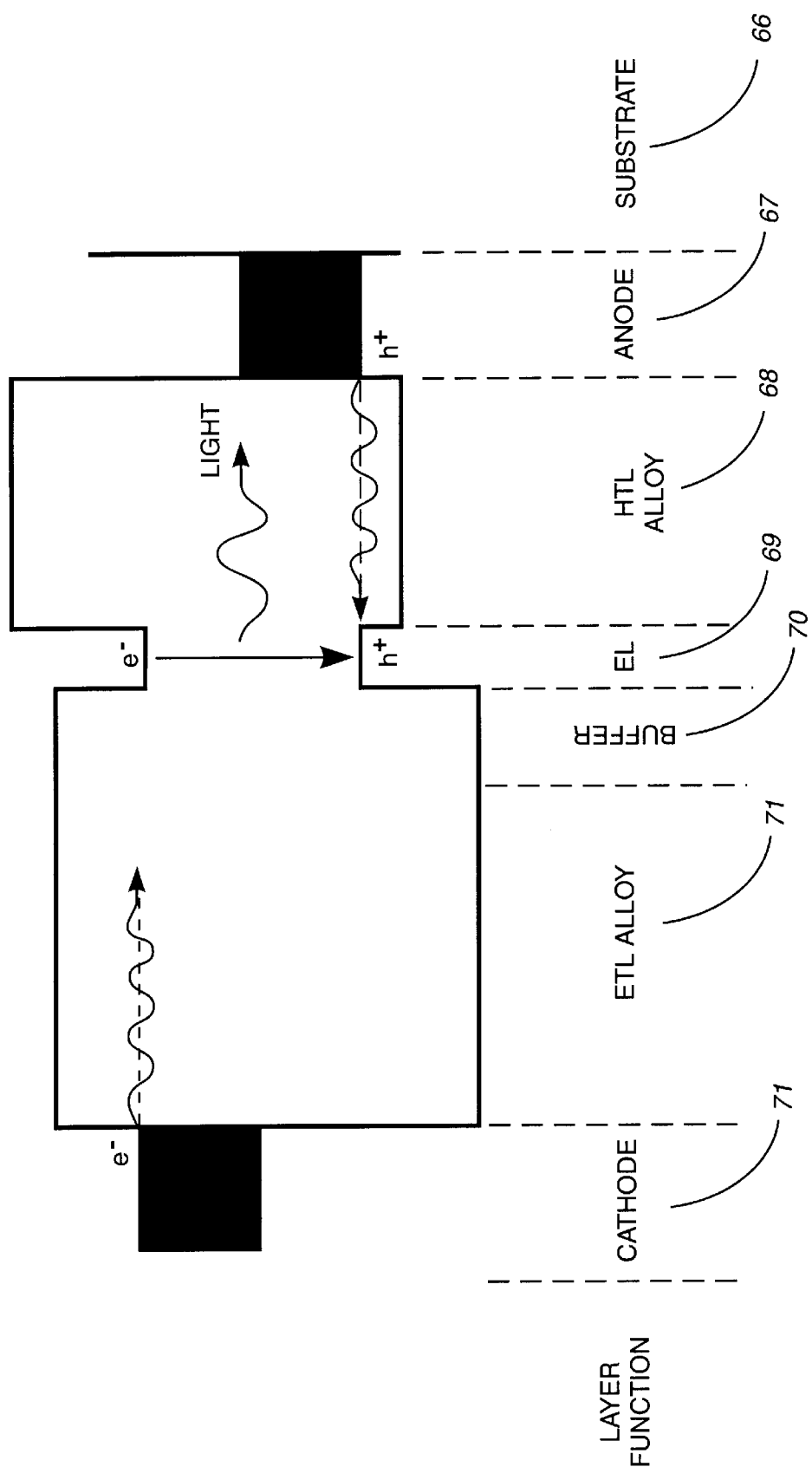
FIG. 7B shows the band diagram of the device illustrated in FIG. 7A.

A second device, based on the three-layer device structure disclosed by Adachi et al. in ACTA Polytechnica Scandinavica, but in accordance with the present invention, is illustrated in FIGS. 7A and 7B. This embodiment incorporates both alloyed ETL 71 and HTL 68 layers and an organic buffer layer 70 between the ETL 71 and emission layer 69, as described above. The active layer 69 confines both electrons and holes to improve the radiative recombination efficiency. Within the gist of the present invention, a second buffer layer between the HTL 68 and emission layer 69 could be added. In addition, the emission layer 69 could be a doped organic material or any other active layer known in the art. Also, the buffer layer 70 could be any of a variety of organic materials as opposed to the organic material also chosen for the ETL 71. In the present example, the organic/inorganic HTL alloy 68 (TAD/Ge) is deposited onto an ITO anode 67 on a glass substrate 66. The organic emission region 69 comprises triphenylamine derivative (NSD). An oxadiazole derivative (PBD) is used both as organic buffer layer 70 and the organic component of the Al/PBD ETL alloy 71. An Al cathode 72 provides barrierless injection into the Al of the ETL alloy 71.

TABLE 2

Exemplary details of the third embodiment

| Layer | No. | Material | Width | present example | Inorganic content |
|---|---|---|---|---|---|
| substrate | 66 | glass | 0.1 mm–5 mm | 2 mm | |
| anode | 67 | ITO | 10–300 nm | 70 nm | |
| HTL alloy | 68 | Ge/TAD | 2–1000 nm | 175 nm | 25% |
| emission layer | 69 | NSD | 1–100 nm | 25 nm | |
| buffer | 70 | PBD | 1–100 nm | 10 nm | |
| ETL alloy | 71 | Al/PBD | 2–1000 nm | 200 nm | 10% |
| cathode | 72 | Al | 10–2000 nm | 60 nm | |

Figure 8B:
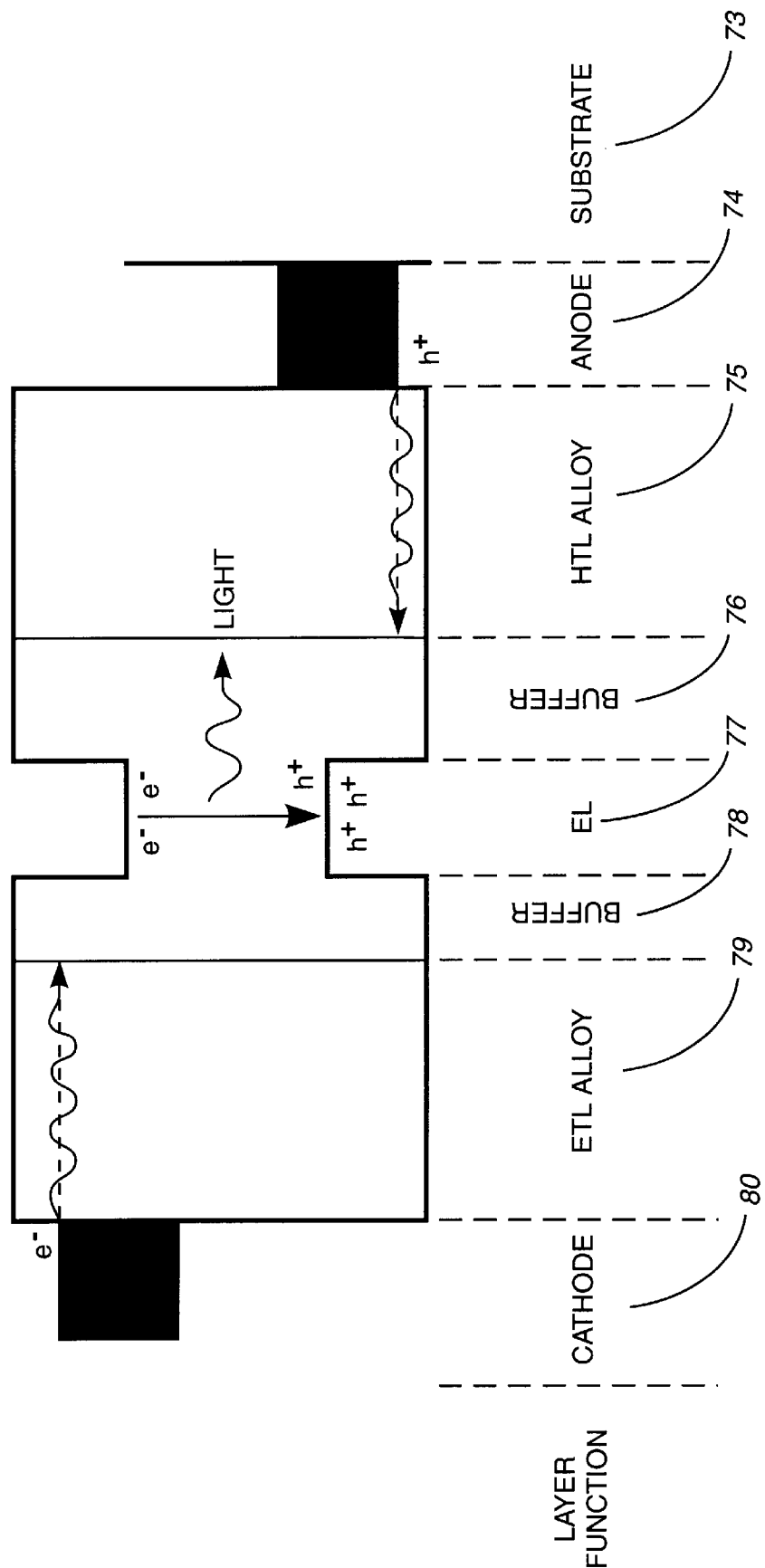
FIG. 8B shows the band diagram of the device illustrated in FIG. 8A.

A fourth embodiment of the present invention is illustrated in FIGS. 8A and 8B. This device is distinguished by the organic matrix material being uniform throughout the structure with the exception of the emission layer 77. An advantage is that the organic matrix material can be chosen for its stability, large bandgap, compatibility with electroluminescent dopant impurities, and a small diffusion coefficient for additives, while the individual device functions can be optimized by the choice of additives in each region. An excellent matrix material is 3,4,7,8 naphthalenetracarboxylic dianhydride (NTCDA), because it can be made to crystallize, forming a highly stable, diffusion resistant wide bandgap organic matrix which is known to be compatible with organic luminescence as observed by So et al. in their already mentioned article. A suitable emission layer 77 comprises 3,4,9,10 perylenetetracarboxylic dianhydride (PTCDA) which forms a quantum well in NTCDA confining both electrons and holes. Within the gist of the present invention, the PTCDA could be doped to improve the luminescence efficiency or to alter the emission wavelength. Likewise, a doped NTCDA could be used as the emission layer, realizing a single organic matrix throughout, provided that the dopants were efficient enough to overcome the lack of carrier confinement in the emission layer. In the present example, the organic/inorganic HTL alloy 75 (NTCDA/Au) is deposited onto an ITO anode 74 on a glass substrate 73. NTCDA buffer layers 76, 78 separate the Coumarin 540 doped PTCDA emission region 77 from the HTL 75 on one side and the NTCDA/Al alloy ETL 79 on the other. An Al cathode 80 provides barrierless injection into the Al of the ETL alloy 79.

TABLE 3

Exemplary details of the fourth embodiment

| Layer | No. | Material | Width | present example | Inorganic content |
|---|---|---|---|---|---|
| substrate | 73 | glass | 0.1 mm–5 mm | 1 mm | |
| anode | 74 | ITO | 10–300 nm | 30 nm | |
| HTL alloy | 75 | Au/NTCDA | 2–1000 nm | 180 nm | 10% |
| buffer | 76 | NTCDA | 1–100 nm | 5 nm | |
| emission layer | 77 | Coumarin doped PTCDA | 1–100 nm | 20 nm | |
| buffer | 78 | NTCDA | 1–100 nm | 10 nm | |
| ETL alloy | 79 | Al/NTCDA | 2–1000 nm | 200 nm | 15% |
| cathode | 80 | Al | 10–2000 nm | 30 nm | |

In the structures of FIGS. 6A, 7A, and 8A the light is emitted from the active region, or to be more precise the emission layers (EL) thereof, through the HTL, transparent ITO anode and glass substrate into the half space below the substrate plane. For this reason it is important that all layers and contacts being in the light path are not strongly absorbing in the wavelength range emitted by the device. This is achieved by limiting the alloys to moderate inorganic concentrations and thicknesses such as those given in the above three examples. Semiconductors conduct charge less efficiently than metals and generally require a higher alloy content in order to achieve similar performance. Since semiconductors absorb light much less strongly than metals, higher alloy contents are feasible.

It is often desirable to emit light through both contacts or through the top only in the case of either an opaque or reflective bottom contact or substrate. The present invention enables this function by permitting a semiconductor, doped or undoped, as the top contact in conjunction with an organic/inorganic alloy transport layer directly beneath. As mentioned above, semiconductors absorb light much less strongly than metals and therefore a thick semiconductor top contact can be designed without losing efficiency. An advantage of being able to use a thick semiconductor top contact is that the entire structure can be safely capped by a transparent metal, such as ITO, to minimize lateral resistances. It is not possible to directly deposit ITO onto OLEDs because of the destructive nature of the plasma deposition processes commonly used as well as the oxygen chemistry present.

In the following some display embodiments, based on and enabled by the present invention, are disclosed.

It would be advantageous if one could integrate OLEDs onto Si substrates because prior to OLED deposition, the substrate could be fabricated to contain active Si devices, such as for example an active matrix, drivers, memory and so forth. Such a structure can be a very inexpensive small area organic display with high resolution and performance realized in the Si. An OLED, OLED arrays or an OLED display may either by grown directly on such a Si substrate carrying Si devices, or it may be fabricated separately and flipped onto the Si substrate later. A problem is that traditional Si metallizations are chosen for their stability and are consequently not good injectors of charge into conventional OLEDs. Traditional OLED cathode metals are not stable in Si processes or air. Another problem is that transparent top contacts are needed because Si is not transparent. The present invention offers a solution to these problems. The disclosed organic/inorganic alloy electron transport layer permits a stable cathode metal to inject electrons so that Si processes are compatible with OLED. The organic/inorganic alloy HTL allows better anode choice than ITO in the anode-up geometry which cannot be sputtered onto OLEDs due to mechanical plasma damage and harmful oxygen chemistry. Alloyed HTLs provide the option of thicker semiconducting contacts onto which ITO or another transparent conductor can be deposited. The present invention also permits an inert, semitransparent thin Au layer to inject into the HTL without the harmful effects of a barrier.

An organic array or display structure formed on a Si substrate is illustrated in FIG. 9 and described in the following. This display comprises a Si substrate 90 which has integrated circuits comprising active and/or passive devices such as memory cells, drivers, capacitors, transistor etc. (these devices are not shown). On top of the Si integrated circuit stable cathode metals 91 are patterned to connect the Si devices to the OLEDs 92. An OLED, beginning with an organic/inorganic alloy ETL in the anode-up geometry is deposited on the patterned cathodes 91 and Si substrate 90. The OLEDs 92 also incorporate organic/inorganic alloy HTLs and a nearly transparent semiconductor anode 93. Finally, a thick ITO cap 94 is provided. It is to be noted that no details of the OLED(s) are shown for sake of simplicity. Another array or display embodiment, where the OLEDs have the cathode up, is illustrated in FIG. 10. In this Figure, OLEDs 97 on top of a Si substrate 95 are schematically shown. Patterned ITO 100 is fully compatible with Si processing so the anode 96 does not necessarily require the present invention. The problem with cathode-up OLEDs is that a transparent, reliable cathode 98 is needed. Usually, good electron injectors are not stable and will degrade in air or in reactions during and after transparent metal deposition. An organic/inorganic alloy ETL (being one of the stack of layers forming the OLEDs indicated by reference number 97) enables the cathode 98 to be chosen purely for its properties as a stable, transparent or semitransparent barrier between the OLEDs 97 and subsequent layers and/or the processing or operational environment.

For example, an Al-metallized Si chip 95 on which ITO anodes 96, 100 are patterned may serve as substrate for an OLED array or display 97. One such OLED comprises (from the bottom to the top): a stable anode layer, e.g. ITO 100, an optional organic/inorganic alloy HTL, an organic doped or undoped active region, an organic/inorganic alloy ETL, a thin stable metal semitransparent interlayer cathode 98, and a transparent metal or semiconductor cap metallization 99.

Another possible display embodiment, illustrated in FIG. 11, is described below. This display comprises a transparent substrate 102 on top of which amorphous-Si or poly-Si structures are formed using the same technology developed for active matrix liquid crystal displays. Usually the Si is structured to provide thin-film-transistors 101 (TFTs) and other devices, to produce an active matrix. The Si devices 101, 102 formed may then be covered or planarized by special layers 104. Color filters 102 can be provided, in addition, if the OLEDs emit white light. The Si devices include structured ITO contact metallization 103, for example, onto which OLEDs 105 can be deposited. An advantage of this approach is that entrenched active matrix liquid crystal display (AMLCD) technology can be leveraged in combination with OLEDs to realize inexpensive, high performance AM displays over large areas. Furthermore, clever design permits light to be emitted through the glass substrate so no transparent top contact is needed.

Any of the above structures might be further improved in that a special diffusion barrier layer, distinct from the buffer layers, is placed between the HTL or ETL and active region so as to further reduce diffusion of inorganic components from the organic/inorganic alloy into the recombination area. I.e., one might insert such a diffusion barrier either between the HTL and organic buffer layer or between the organic buffer layer and active region if one wants to further reduce the cross diffusion of molecules across these interfaces. The same could be done on the side from where electrons are injected. Notably, the diffusion barrier could be a pure inorganic, pure organic, or an organic/inorganic alloy layer. It is chosen to suppress diffusion of material across the interfaces into the active region. It must also be compatible with electroluminescent light emission.

In the following some examples of the different organic materials which can be used are given. Alq, also known as Alq3 may be replaced by other 8-hydroxyquinoline metal complexes such as Znq2, Beq2, Mgq2, ZnMq2, BeMq2, and AlPrq3, for example. These materials can be used as ETL or emission layer. Other materials which can be used as ETL are: cyano-substituted polymers, didecyl sexithiophene (DPS6T), bis-triisopropylsilyl sexithiophene (2D6T), Azomethin-zinc complexes, pyrazine (e.g. BNVP), strylanthracent derivatives (e.g. BSA-1, BSA-2), 1,2,4-triazole derivative (TAZ).

The following materials are particularly well suited as emission layers: Anthracene, phyridine derivatives (e.g. ATP), Azomethin-zinc complexes, pyrazine (e.g. BNVP), strylanthracent derivatives (e.g. BSA-1, BSA-2), Coronene (also suited as dopant), Coumarin (also suited as dopant), DCM compounds (DCM1, DCM2; both also suited as dopants), distyryl arylene derivatives (DSA), alkyl-substituted distyrylbenzene derivatives (DSB), benzimidazole derivatives (e.g. NBI), naphthostyrylamine derivatives (e.g. NSD), oxadiazole derivatives (e.g. OXD, OXD-1, OXD-7), N,N,N,N'-tetrakis(m-methylphenul)-1,3-diaminobenzene (PDA), Perylene, phenyl-substituted cyclopentadiene derivatives, 12-phthaloperinone derivatives (PP), squarilium dye (Sq), 1,1,4,4-tetraphenyl-1,3-butadiene (TPBD), poly(2-methoxyl,5-(2'ethyl-hexoxy)-1,4-phenylene-vinylene (MEH-PPV), sexithiophene (6T), poly (2,4-bis(cholestanoxyl)-1,4-phenylene-vinylene (BCHA-PPV), Polythiophenes, poly(p-phenylenevinylene) (PPV).

The below materials are suited as HTL: Cu(II) phtalocyanine (CuPc), distyryl arylene derivatives (DSA), naphthalene, naphthostyrylamine derivatives (e.g. NSD), Quinacridone (QA; also suited as dopant), poly(3-methylthiophene) family (P3MT), Perylene, polythiophene (PT), 3,4,9,10-perylenetetracarboxylic dianhydride (PTCDA) (also suited as isolator), tetra phenyldiamino-diphenyl (TPD-1, TPD-2, or TAD), poly(2-methoxyl,5-(2'ethyl-hexoxy)-1,4phenylene-vinylene (MEH-PPV), poly (9-vinylcarbazole) (PVK).

Another material suited as matrix for the present OLED embodiments is naphthalene 1,4,5,8-tetracarboxylic-1,8,4,5-dianhydride.

There are many other organic materials known as being good light emitters, and many more will be discovered. These materials can be used as well for making light emitting structures according to the present invention. Examples of such materials are given in the publications cited in the introductory portion of the present description. The contents of these publications is herewith incorporated by means of reference.

Monomeric devices are routinely made by vacuum evaporation. This is extremely compatible with alloying because it permits precise control of layer thicknesses, excellent uniformity, and reproducible alloying via concurrent evaporation of two or more materials. It also provides an extremely clean environment for device formation and high purity source materials can be maintained. Evaporation can be performed in a Bell jar type chamber with independently controlled resistive and electron-beam heating of sources. It can also be performed in a Molecular Beam Deposition System incorporating multiple effusion cells and electron-beam evaporators.

The inorganic component introduced into the organic hole and/or electron transport layers, according to the present invention, may either be a metal or an elemental semiconductor, or a compound semiconductor. The elemental semiconductor or compound semiconductors may be intentionally doped in order to alter or enhance their electrical characteristics. The following materials are particularly well suited: Al, Au, Pt Ag, Be, Ni, In, Ga, As, Sb, Sn, Se, Cd, Te, Hg, or alloys thereof. Also suited are Ge, Si, InAs, InN, InP, GaAs, GaN, GaP, AlAs, ZnTe, MgTe, ZnSe, C, CdTe, HgTe or alloys thereof.

Oligomeric and Polymeric organics can also be deposited by evaporation of their monomeric components with later polymerization via heating or plasma excitation at the substrate. It is therefore possible to alloy these by coevaporation also, and they are fully compatible with monomeric compounds.

In general, polymer containing devices are made by dissolving the polymer in solvent and spreading it over the substrate, either by spin coating or a blade. In this case, the inorganic must also be suspended or dissolved in solvent. After coating the substrate, the solvent is dissolved by heating. This method is not promising for the development of multilayer structures such as described herein since one would have to have a solvent heating cycle for each layer, as well as a new solvent which does not redissolve any of the previously deposited layers. More interesting to use is the possibility of making a polymer/inorganic transport layer on top of which monomeric layers are evaporated, possibly also incorporating alloys. If the polymer is handled in an inert atmosphere prior to introduction to vacuum, sufficient cleanliness for device fabrication is maintained.

It is to be mentioned that the structures shown in FIGS. 5–8A are broad area light emitting diodes. Any other kind of light emitting diode structures, such as mesa structures for example, are also well suited. The present invention, which concentrates on the improvement of certain layers within a light emitting diode structure and which provides additional layers inside diodes, can be employed in any kind of organic light emitting device.

I claim:

1. A light emitting device comprising:

an organic, electroluminescent active region; and at least one organic charge transport layer for transporting charges from an electrode to said active region, wherein said organic charge transport layer includes an inorganic component introduced to form an organic/inorganic alloy material for improved charge transport, and the concentration of said inorganic component introduced to form the organic/inorganic alloy material is graded such that the concentration decreases or increases with distance from said active region.

2. The light emitting device of claim 1, wherein said organic charge transport layer having said inorganic component serves as electron transport layer transporting electrons from said electrode, serving as cathode, to said active region.

3. The light emitting device of claim 1, wherein said organic charge transport layer having said inorganic component serves as hole transport layer transporting holes from said electrode, serving as anode, to said active region.

4. The light emitting device of claim 1, wherein said at least one organic charge transport layer includes:

a first organic charge transport layer having said inorganic component serving as electron transport layer transporting electrons from said electrode, serving as cathode, to said active region; and a second organic charge transport layer having said inorganic component serving as hole transport layer transporting holes from said electrode, serving as anode, to said active region.

5. The light emitting device of claim 1, wherein said inorganic component is either a metal or an elemental semiconductor or a compound semiconductor, said elemental semiconductor or compound semiconductor may be intentionally doped in order to alter or enhance their electrical characteristics.

6. The light emitting device of claim 5, wherein said inorganic component introduced to form an organic/inorganic alloy material is chosen such that a charge transport layer is obtained which has a reduced resistivity in comparison with a purely organic charge transport layer.

7. The light emitting device of claim 5, wherein said inorganic component introduced to form an organic/inorganic alloy material is chosen such that the inorganic component provides the primary channel for charge injection from the electrode into the organic/inorganic alloy material.

8. The light emitting device of claim 5, wherein said inorganic component introduced to form an organic/inorganic alloy material is chosen such that the inorganic component provides, due to its dispersed nature in the organic host matrix of said organic charge transport layer, for improved charge transfer from the inorganic of said organic/inorganic alloy material into the organic of said active region.

9. The light emitting device of claim 1 or 5, wherein said active region comprises either:

a stack of at least two electroluminescent organic emission layers; or an organic compound doped with one or more impurities, organic or inorganic, chosen to dominate and enhance the electroluminescence; or a stack of at least two electroluminescent organic emission layers, some of which may be doped to dominate or enhance the electroluminescence of that particular electroluminescent organic emission layer, or a stack of at least two organic layers, in which the role of one or more of said organic layers is to electrically confine one or more carrier types to improve the emission of an adjacent organic layer.

10. The light emitting device of claim 1 or 5, wherein the electrode is either a metal contact in direct conjunction with the organic/inorganic alloy material, said inorganic component being a metal, or a semiconductor contact in direct conjunction with the organic/inorganic alloy material, said inorganic component being a metal, or a semiconductor contact in direct conjunction with the organic/inorganic alloy material, said inorganic component being a semiconductor, or a metal contact in direct conjunction with the organic/inorganic alloy material, said inorganic component being a semiconductor.

11. The light emitting device pursuant to any one of claims 1–8, wherein there is a single organic matrix throughout the device, discrete layers of the device being distinguished only by the inorganic components in the transport layers, and the organic or inorganic electroluminescent dopants in the active region.

12. The light emitting device pursuant to any one of claims 1–8, wherein a single organic matrix is provided throughout the device with the exception of the organic emission layer being part of said active region, the organic emission layer of said active region being chosen for its emission properties in concert with the organic matrix in the surrounding device.

13. The light emitting device pursuant to any one of claims 1–8, wherein the device is structured so as to emit light into the half space above the substrate through the electrode serving as top contact, the respective electrode including a transparent or semitransparent metal or semiconductor.

14. An organic light emitting array or display comprising at least two light emitting devices pursuant to any one of claims 1–8, said light emitting devices being deposited or flipped onto a common substrate.

15. The organic light emitting array or display of claim 14, wherein said common substrate is a crystalline Silicon substrate comprising devices and/or circuits and/or electrical connections.

16. The organic light emitting array or display of claim 15, wherein said devices and/or circuits and/or electrical connections are designed for driving and controlling at least one of said light emitting devices.

17. The organic light emitting array or display of claim 15, wherein said light emitting devices are deposited cathode first onto said Silicon substrate, and wherein a stable Silicon process metallization injects electrons efficiently into the organic/inorganic alloy electron transport layers of said light emitting devices, and/or a transparent or semitransparent top anode is formed on top of said light emitting devices, arranged such that light emitted by said light emitting devices is emitted into the half space above the Silicon substrate plane.

18. The organic light emitting array or display of claim 15, wherein said light emitting devices are deposited anode first onto said silicon substrate, a stable silicon process metallization, with or without an additional patterned indium-tin-oxide (ITO), injects holes efficiently into said light emitting devices, and a transparent or semitransparent top cathode is formed on top of said light emitting devices, and arranged such that light emitted by said light emitting devices is emitted into the half space above the silicon substrate plane.

19. The organic light emitting array of claim 14, wherein said light emitting devices are deposited cathode first onto said common substrate, which is preferably a glass substrate, said light emitting devices being arranged such that light emitted by said light emitting devices is emitted into the half space below said common substrate plane.

20. The organic light emitting array or display of claim 19, wherein the substrate and the entire array or display are flexible.

21. A light emitting device comprising:

an organic, electroluminescent active region;

at least one organic charge transport layer for transporting charges from an electrode to said active region; and an organic buffer layer between the organic charge transport layer and said active region, said organic buffer layer having the purpose of reducing or suppressing quenching by the inorganic component in said organic charge transport layer of the emission layer of said active region, wherein said organic charge transport layer includes an inorganic component introduced to form an organic/inorganic alloy material for improved charge transport.

22. The light emitting device of claim 21, further comprising another organic buffer layer between said active region and another charge transport layer.

23. A light emitting device comprising:

an organic, electroluminescent active region; and at least one organic charge transport layer for transporting charges from an electrode to said active region, wherein said organic charge transport layer includes an inorganic component introduced to form an organic/inorganic alloy material for improved charge transport, and the inorganic component is selected from a group consisting of Ge, Si, InAs, InN, InP, GaAs, GaN, and GaP.

24. The light emitting device of claim 23, wherein the inorganic component is either Ge or Si.

* * * * *